United States Patent [19]

Agarwala et al.

[11] Patent Number: 5,629,859

[45] Date of Patent: May 13, 1997

[54] METHOD FOR TIMING-DIRECTED CIRCUIT OPTIMIZATIONS

[75] Inventors: Sanjive Agarwala, Dallas; Patrick W. Bosshart, Plano, both of Tex.

[73] Assignee: Texas Instruments Incorporated, Dallas, Tex.

[21] Appl. No.: 304,625

[22] Filed: Sep. 12, 1994

Related U.S. Application Data

[63] Continuation of Ser. No. 964,585, Oct. 21, 1992, abandoned.

[51] Int. Cl.⁶ ................................................. G06F 15/00
[52] U.S. Cl. ............................ 364/489; 364/488; 364/490; 371/22.3; 371/22.1
[58] Field of Search ................................. 364/488, 489, 364/490, 491; 326/41, 44, 101, 39, 38, 37; 395/143, 133, 500; 340/825.83; 371/22.1, 22.3, 22.5

[56] References Cited

U.S. PATENT DOCUMENTS

| | | | |
|---|---|---|---|
| T943,001 | 2/1976 | Mennone | 364/490 |
| 3,617,714 | 11/1971 | Kernighan et al. | 364/488 |
| 4,263,651 | 4/1981 | Donath et al. | 364/491 |
| 4,593,362 | 6/1986 | Bergeron et al. | 364/488 |
| 4,698,760 | 10/1987 | Lembach et al. | 364/490 |
| 4,752,887 | 6/1988 | Kuwahara | 364/491 |
| 4,805,113 | 2/1989 | Ishii et al. | 364/491 |
| 4,916,627 | 4/1990 | Hathaway | 364/490 |
| 4,931,946 | 6/1990 | Ravindra et al. | 364/489 |
| 5,157,618 | 10/1992 | Ravindra et al. | 364/489 |
| 5,168,455 | 12/1992 | Hooper | 364/490 |
| 5,175,843 | 12/1992 | Casavant et al. | 395/500 |
| 5,189,629 | 2/1993 | Kohnen | 364/489 |
| 5,191,541 | 3/1993 | Landman et al. | 364/489 |
| 5,210,700 | 5/1993 | Tom | 364/489 |
| 5,218,551 | 6/1993 | Agrawal et al. | 364/489 |
| 5,231,589 | 7/1993 | Itoh et al. | 364/489 |
| 5,237,514 | 8/1993 | Curtin | 364/490 |
| 5,251,147 | 10/1993 | Finnerty | 364/489 |
| 5,282,147 | 1/1994 | Goetz et al. | 364/489 |
| 5,282,148 | 1/1994 | Poirot et al. | 364/489 |
| 5,331,568 | 7/1994 | Pixley | 364/489 |
| 5,381,343 | 1/1995 | Bamji et al. | 364/489 |
| 5,404,313 | 4/1995 | Shiohara et al. | 364/490 |

*Primary Examiner*—Kevin J. Teska
*Assistant Examiner*—Jacques Louis-Jacques
*Attorney, Agent, or Firm*—Carlton H. Hoel; W. James Brady, III; Richard L. Donaldson

[57] ABSTRACT

Shown is a method of optimizing the performance of a logic circuit. The circuit is represented as a set of vertices, with each element output being represented as a vertex whose element is selected for local optimization on a depth first traversal basis. As each element is optimized, its path length is calculated by partial path lengths, which are known to be either valid or invalid as a result of prior local optimizations. Specifically, invalid path lengths to the associated vertex from circuit inputs are re-computed and added to valid path lengths from the associated vertex to a circuit output.

5 Claims, 2 Drawing Sheets

METHOD FOR TIMING-DIRECTED CIRCUIT OPTIMIZATIONS

This application is a continuation of application Ser. No. 07/964,585, filed Oct. 21, 1992, now abandoned.

TECHNICAL FIELD OF THE INVENTION

This invention relates to logic circuit design, and more particularly to optimizing the speed at which signals at circuit inputs arrive at circuit outputs; or optimizing other parameters such as area or power while meeting speed requirements.

BACKGROUND OF THE INVENTION

An important aspect of logic circuit design is "timing-driven" optimization, which attempts to improve the speed at which signals at circuit inputs will arrive at circuit outputs. In contrast to architectural optimization techniques, such as those that focus on faster algorithms, timing-driven optimization focusses on changes to individual circuit elements. Timing-driven optimization may involve a number of restructuring techniques, such as gate input reordering, transistor sizing, buffer insertion, and in BiCMOS circuits, selection and deselection of BiCMOS elements.

Timing-driven optimization includes timing analysis of various restructuring choices to determine the desirability of one choice over another. Typically, timing evaluations are incremental, in the sense that every change to the characteristics of any element in the design invalidates the design's currently calculated timing characteristic and requires a timing recomputation before another element is optimized.

In existing optimization methods, these incremental timing recomputations can be computationally expensive. In some methods, each local optimization requires recomputation of delays at all preceding and succeeding elements.

A need exists for a method of performing timing analysis during timing-driven circuit optimization that reduces computation time.

SUMMARY OF THE INVENTION

One aspect of the invention is a method of performing a time-driven optimization on a logic circuit represented as a set of input vertices, element vertices, and output vertices, and a set of edges. First, a forward delay value at each vertex of the circuit is computed. For a given input vertex of the circuit, the set of element vertices on all paths from that input vertex to an output vertex is distinguished. From that set, an element vertex is selected for local computation, on a depth first traversal basis. For the local computation, a local path length at this selected element vertex, is obtained, which includes a local measurement of edge delays of the element associated with the selected element vertex. For the local optimization, the element associated with the selected element vertex is optimized by changing one or more of its characteristics. The optimization is evaluated to determine if it is acceptable. If the optimization is accepted, the edge delays to the selected element vertex are recomputed, and the forward delay values at element vertices following the selected element vertex are invalidated. These element selection, local recomputation, and local optimization steps are repeated for each vertex in the selected set. Then, the process is repeated for a new input vertex, until all elements have been optimized.

Thus, as a general summary, the method begins by computing all forward delays. During local optimizations, backward delays are computed, while gradually invalidating some forward delays. This results in valid backward delays, but a forward sweep may be necessary to recompute the invalidated forward delays.

A technical advantage of the invention is that it minimizes the computational complexity of time-driven circuit optimization. The computation time has a linear relationship to the number of circuit elements. A large design can be optimized in acceptable and predictable runtimes.

DETAILED DESCRIPTION OF THE INVENTION

Figure 1:
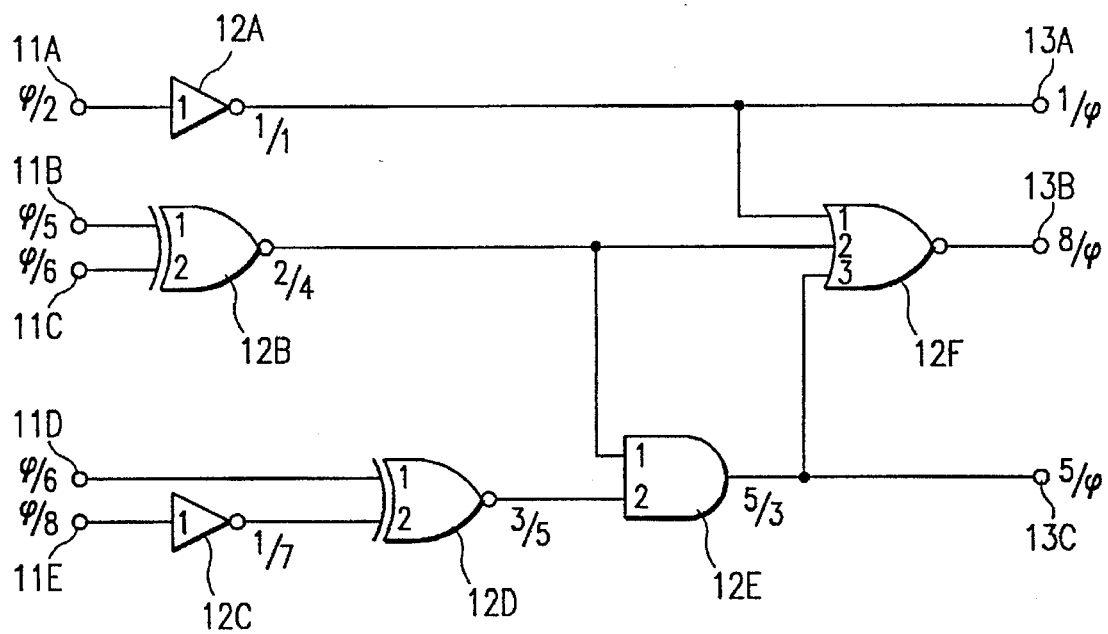
FIG. 1 illustrates a simple logic circuit and the manner in which delays at circuit inputs, at element outputs and at circuit outputs are determined.

FIG. 1 illustrates a simple logic circuit 10 and the manner in which delays are determined in accordance with the invention. The circuit 10 is combinational in the sense that its elements 12 have no latched states. Circuit 10 is greatly over simplified for purposes of example—a typical circuit used with the method of the invention would have many more elements 12.

Circuit 10 has five circuit inputs 11A–11E, six circuit elements 12A–12E, and three circuit outputs 13A–13C. An "element" 12 is any part of the circuit 10 on which optimization may be performed. In the exemplary circuit 10 of FIG. 1, the elements 12 include two inverters 12A and 12C, XNOR gates 12B and 12D, an AND gate 12E, and an NOR gate 12F.

Each element 12 has certain delay characteristics, which are indicated in FIG. 1 at the input of that element 12. An element 12 has as many "intrinsic" delays as it has inputs. For example, the delay through inverter 12A is 1 unit. The delay through gate 12B depends on which of its two inputs is being considered. The signal through a first gate input has a delay of 1 unit, whereas a signal through a second gate input has a delay of 2 units.

Although FIG. 1 shows only intrinsic delays within elements 12, it could be assumed that delays from propagation through connectors are lumped together with element delays or that they are insignificant. In any event, the concepts herein could be easily adapted to include additional calculations for connector delays.

At each circuit input 11, at each element output, and at each circuit output 13, the maximum forward delay (FD) and the maximum backward delay (BD) are shown as FD/BD. The units of time to measure these delays are arbitrary, but will typically be in terms of nanoseconds.

Forward delays are timing path delays associated with the propagation time of a signal from circuit inputs 11 to circuit outputs 13. For simplicity, an initial delay of zero is assumed at each circuit input 11, but any initial delay can be specified. The maximum forward delay at any circuit node is the maximum delay seen by an input signal arriving at that node.

Backward delays are timing path delays associated with propagation from circuit outputs 13 to circuit inputs 11. An initial delay of zero is assumed at each circuit output 13, but any arbitrary delay value could be assumed. The maximum backward delay at any node represents the maximum delay going from that node to a circuit output 13.

The timing path length of the slowest path on which a circuit element 12 resides is the sum of the maximum forward delay and the maximum backward delay at the output of that element 12. Thus, in FIG. 1, the path length of the slowest path on which element 12B resides is 6 units, which is the sum of 2 forward delay units plus 4 backward delay units.

The critical path of the entire circuit 10 is the path having the slowest path length from an input 11 to an output 13. Thus, in FIG. 1, the critical path is from input 11E, through elements 12C, 12D, 12E, and 12F, and to output 13B. The critical path length is 8 units. At the output of each element 12 on the critical path, the sum of the forward delay and backward delay is the same as the critical path length.

For timing-driven optimization, the effect of any local optimization, i.e., a change to a characteristic of a single element 12, on the performance of the entire circuit must be known. Previously computed delays may be affected by the change and may no longer be valid. For example, a change to element 12E results in a change in the intrinsic delay through 12E, as well as to the loading capacitance of elements 12B and 12D.

To determine whether a local optimization is a good one, the path length of the paths on which the affected element 12 resides must be compared to the critical path length (or to some other target path length). If the change to the element 12 improves some parameter such as area or power and does not increase any of its path lengths over that of the target path length, then the local optimization is acceptable and a next local optimization can be performed. Also, if the path length is longer than acceptable and the optimization decreases the path length, the optimization is acceptable.

A basic concept of the invention is performing local optimizations in a manner that makes use of partially valid path delays. For every local optimization, overall path delays may be only partially valid. At any gate being optimized, backward delays are valid all the way to circuit outputs and forward delays are valid all the way to circuit inputs. As a result, at that gate, a valid total path delay is available. As explained below, a "depth first" ordering of local optimizations permits the use of a recursive optimization method that minimizes recomputations.

Figure 2:
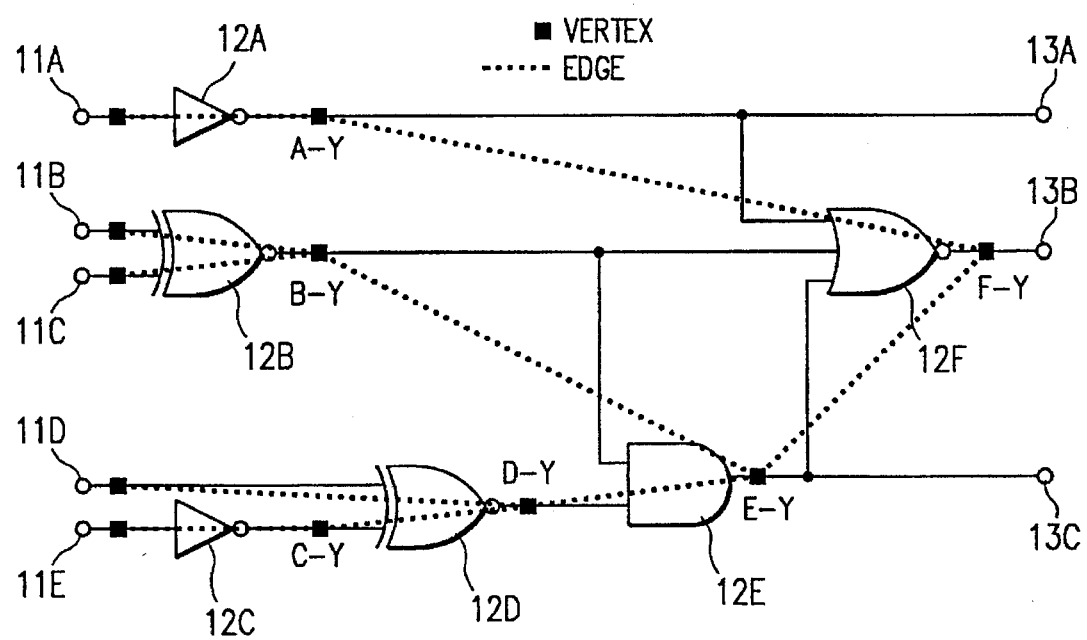
FIG. 2 illustrates how a logic circuit may be represented mathematically in terms of vertices and edges.

FIG. 2 illustrates how a circuit may be represented mathematically in terms of vertices and edges. A vertex corresponds to a circuit input 11, an output of an element 12, or a circuit output 13. An edge corresponds to a path from one vertex, through an input of a succeeding element 12, to a vertex at the output of that element 12. An edge delay of an element 12 is the internal delay associated with one of element's inputs to its output.

A circuit with a particular structure is represented as a design G, having an ordered triple, (V(G), E(G), and F(G)). The set V(G) is a nonempty set of vertices. The set E(g) is a set of edges. The incidence function, F(G), associates with each edge, an ordered and distinct pair of vertices.

A vertex "succeeds" another vertex if the "succeeding" vertex is on the path from the other vertex to the outputs 13. Similarly, a vertex "precedes" another vertex if a signal starting from the "preceding" vertex can arrive at the other vertex. In the example of FIG. 2, vertices D-Y, E-Y, and F-Y succeed vertex C-Y. Vertices B-Y, C-Y, and D-Y precede vertex E-Y.

Figure 3:
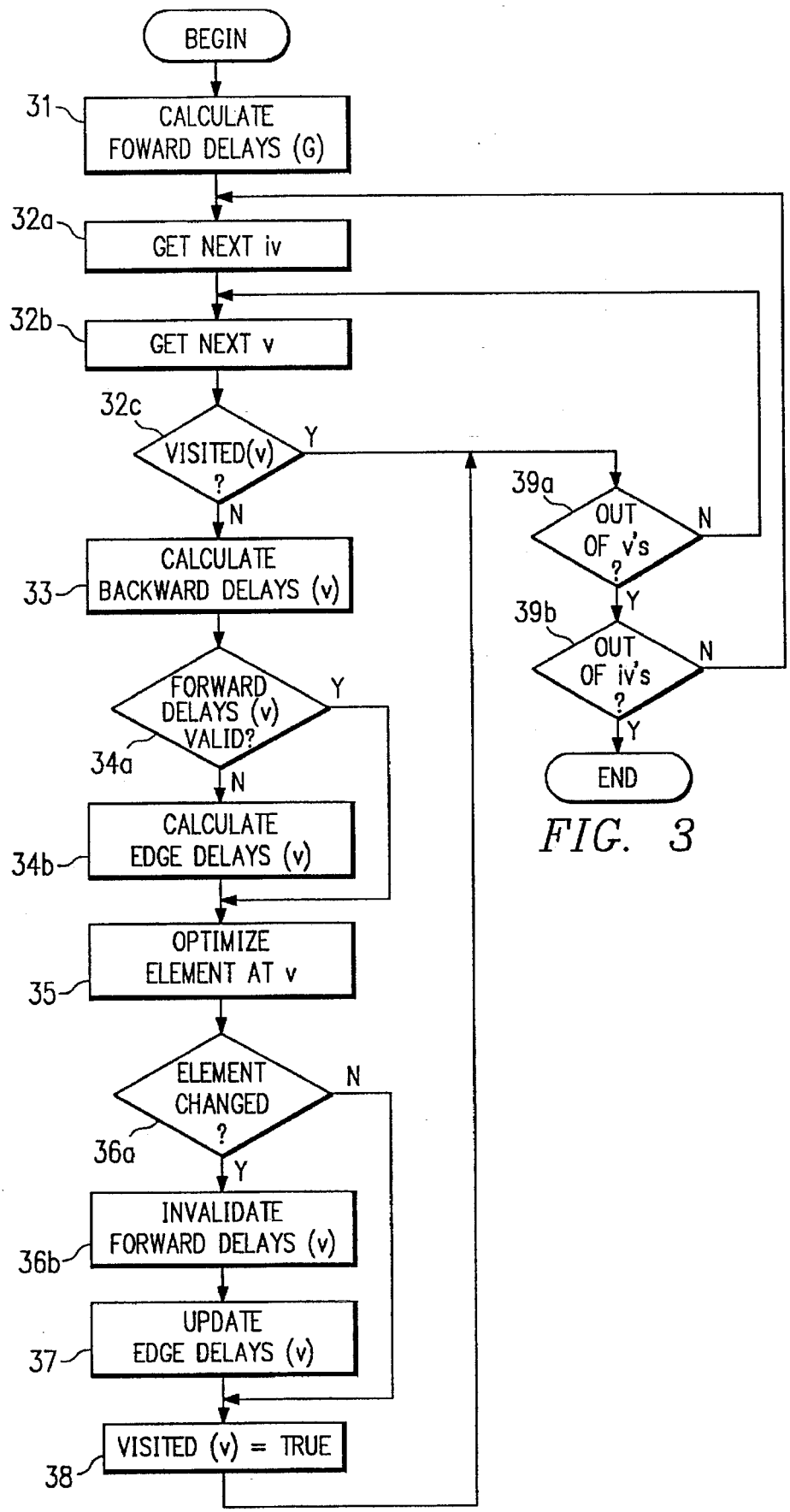
FIG. 3 illustrates the steps of a method of optimizing a logic circuit in accordance with the invention.

FIG. 3 illustrates a method of optimizing a circuit in accordance with the invention. As an overview, the method is performed as a series of local optimizations, such that during each local optimization, a characteristic of a selected element 12 may be changed to optimize the circuit. The method recognizes that as each element 12 is changed, previously computed delay paths may be affected by the change and are no longer valid. If, for example, element 12E is changed, then forward delays at its vertex E-Y and at all succeeding vertices are no longer valid. However, these forward delays need not be recomputed immediately, because all succeeding elements 12 from 12E onward have already been visited.

During each local optimization of an element 12, a local recomputation involves obtaining a valid path length at its vertex. For example, if element 12E is optimized, two steps are performed. First, because of the change in element 12E's characteristics, the loading capacitance as seen by elements 12B and 12D may have changed. Therefore, the forward delays at B-Y and D-Y are invalidated so that during subsequent optimization of 12B and 12D, their forward delays may be re-computed. Second, the edge delays through element 12E from its inputs to its outputs are recomputed. During a subsequent local optimization of elements 12B or 12D, the edge delays of element 12E are used to obtain valid backward delays at their output vertices B-Y or D-Y.

The following description is in terms of "calculating" and "computing" delay values and path lengths. In practical application, the invention is for computer simulations, in which delay values may be calculated and stored.

More specifically, in step 31, the forward delay at each vertex of the circuit is calculated. These are stored and used in subsequent calculations, unless invalidated as a result of a local optimization.

In steps 32a–32c, a current vertex, v, is selected for local recomputation. More specifically, for each vertex, iv, at a circuit input, each vertex, v, on paths from iv to a circuit outputs 13, are selected in a "depth first traversal" order. Each local recomputation at a vertex is followed by a local optimization at the associated element 12. This means that a local optimization of an element 12 is performed only after all of its successor elements 12 have been optimized. In other words, each successor element 12 of an element 12 currently being optimized has already been "visited".

Thus, the selection steps 32a–32c result in a current vertex, v, associated with an element 12, which is to optimized. As an example, if the current input vertex is 11C, the set of possible vertices to be optimized is {B-Y, E-Y, F-Y}. The vertex at E-Y will be selected first if F-Y has already been optimized in a pass of input vertex 11A.

Steps 33–34b are a local recomputation that provides a valid path length at the current vertex, v. In step 33, the backward delay at that vertex is calculated. For example, if it assumed that FIG. 1 illustrates valid delays when vertex E-Y is selected, its backward delay is 3. As explained below, if a prior local optimization has changed element 12F, its edge delay, 3, has already been recomputed and would be incorporated into this calculation.

In the step 34a, a table of vertices is checked to determine if the current vertex has been flagged as having an invalid forward delay. If so, in step 34b, the forward delay associated with that vertex is recomputed. For example, if a prior local optimization has changed element 12F, the forward delay at 12E would be flagged. The edge delays of 12E would be recalculated to reflect any change in the intrinsic delays of 12E caused by the change to 12F.

After steps 33–34b, a valid backward delay from the vertex and a valid forward delay to the vertex are known. These two values can be added together to obtain a valid path length at that vertex. Using the same example as the preceding paragraph, a valid path length at E-Y is known.

Step 35 is to optimize the selected element 12 associated with the current vertex, v. As explained above, this involves changing some characteristic of the element 12 and determining if the change is acceptable. Typically, this will be accomplished by measuring the effect on delays caused by the change, and comparing any affected path lengths to a target path length.

As indicated by steps 36a–37, if the optimization is accepted, the element's edge delay is updated and the forward delays of preceding elements 12 are flagged as being invalid.

In step 38, the current vertex, v, is flagged as having been visited.

As indicated by steps 39a and 39b, steps 33–38 are repeated for each vertex, v, that has not already been visited. At the completion of traversal through the entire design, the backward delays throughout the design are valid. However, some or all forward delays may be invalid. A sweep through the design can be performed to update the invalidated forward delays.

A formal description of the above method can be expressed as several sub-processes called from a main timing and optimization process, each of which operates on the design (G):

```
timing-and-optimization(G)
{
    do-forward-delays(G)
    do-backward-delays-and-optimize(G)
    update-invalid-forward-delays(G)
    print-report(G)
}
```

The above process begins with a sub-process that performs a forward delay sweep for the entire existing design. The next sub-process, do-backward-delays-and-optimize, may be formally expressed with the following steps:

```
do-backward-delays-and optimize(G)
{
    for each vertex that is an element of I(G)
        input-to-output-dft(v)
}
```

This sub-process begins at the vertex, v, of each circuit input 11. For each of these input vertices, v, it performs a depth-first-traversal (dft) subprocess, input-to-output-dft, to each output 13 on a path from that input, i.e., its fanout. This sub-process ensures that each element 12 is visited only once. No element 12 is optimized until after each element 12 in its fanout is optimized.

The dft subprocess is formally expressed with the following steps, with the input variable being a current vertex, v:

```
input-to-output-dft(v)
{
    for each vertex, ov, that is an element of
    the output vertices of v
        if visited (ov) =\ true
            input-to-output-dft(ov)
        delay-prop-and-local-opt(v)
        visited(v) <— true
}
```

This subprocess operates on each of a set of output vertices, ov, that are the immediate successors of the current vertex, v. For example, referring to FIGS. 1 and 2, if the current vertex, v, is vertex B-Y, the set of output vertices, ov, is {E-Y, F-Y}. Each vertex that succeeds vertex, v, is selected in depth-first-traversal order. If a currently selected vertex, ov, has already been visited in a previous pass of the sub-process, it is "passed" and the sub-process operates recursively to select a next vertex in the current set of ov's. If the vertex, ov, has not already been visited, a local optimization is performed on that vertex, which is called as delay-prop-and-local-opt. After each of the current set of ov's is optimized, it is flagged as having been visited.

The sub-process, delay-propagation-and-local-optimization, operates on each new vertex, v, passed to it from the input-to-output-dft sub-process. It has the following steps:

```
delay-propagation-and-local-optimization(v)
{
    propagate-backward-delays(v)
    if invalid forward delays(v)
        recompute forward delays(v)
    element-optimization (element(v))
    if changed(gate(v))
        update-element-delays(v)
        invalidate-forward-delays(v)
}
```

As explained above, this sub-process performs a local recomputation of the path length at the current vertex, v, as well as a local optimization of the associated element 12. If the element 12 is changed, its edge delay is recomputed and forward delays at preceding vertices are invalidated.

The above method has been experimentally performed with forward delays being computed in one sweep and backward delays along with optimizations being performed in another sweep. The method can be adapted to first computing backward delays and next doing forward delays along with optimizations. If multiple optimization sweeps are to be performed, they can be done alternatively in forward and backward delay computation sweeps.

The computational complexity of the optimization process is much improved over existing iterative methods. The forward delay propagation process, do-forward-delays(G), is linear in the number of edges of G, and is thus of the order $O(|E|)$. In the backward delay propagation and optimization step, do-bwd-delays-and-opt(G), if there is a change to an element 12, the overall recursive forward invalidation and recomputation is bounded by the number of vertices, and is of the order $O(|V|)$. Likewise, the updating of backward delays after each local optimization, as well as the final sweep to update forward delays, are of the order $O(|E|)$. Thus, the complexity of the entire method is upper bounded by the size of the design, in particular, the number of its edges.

OTHER EMBODIMENTS

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method of performing a time-driven optimization on a logic circuit represented as a set of input vertices, element vertices for associated circuit elements, and output vertices, and a set of edges connecting ordered pairs of vertices, comprising the steps of:

calculating a backward delay value at each vertex of the logic circuit;

for a given output vertex of the logic circuit, selecting a set of element vertices on all paths from that output vertex to an input vertex;

selecting an element vertex from said set of element vertices for local computation, on a depth first traversal basis;

calculating a path length at said selected element vertex, wherein said path length includes a local computation of edge delays of the element associated with said selected element vertex;

optimizing the circuit element associated with said selected element vertex by changing one or more characteristics of said circuit element;

updating the edge delays of the edges associated with said selected element vertex as a result of the local optimization;

invalidating the backward delay values at element vertices immediately succeeding said selected element vertex;

invalidating backward delay values at all predecessor vertices of said immediately succeeding vertices; and repeating said selecting, calculating, optimizing, updating, and invalidating steps with respect to each element vertex of said set of element vertices.

2. A method of using a computer to perform a time-driven optimization on a logic circuit represented as a set of input vertices, element vertices for associated circuit elements, and output vertices, and a set of edges connecting ordered pairs of vertices, comprising the steps of:

calculating a forward delay value at each vertex of the logic circuit;

for a given input vertex, selecting a set of element vertices on all paths from that input vertex to an output vertex;

selecting one element vertex from said set of element vertices for local computation, on a depth first traversal basis;

calculating a path length at said selected element vertex, wherein said path length includes a computation of edge delays of the element associated with said selected element vertex;

optimizing the circuit element associated with said selected element vertex by changing one or more characteristics of said circuit element;

updating the edge delays of the edges associated with said selected element vertex as a result of the local optimization;

invalidating the forward delay values at element vertices preceding said selected element vertex; and repeating said selecting, calculating, optimizing, updating, and invalidating steps with respect to each element vertex of said set of element vertices.

3. A method for optimizing a logic circuit represented as a set of input vertices, element vertices for associated circuit elements, and output vertices, plus directional edges connecting ordered pairs of vertices, comprising the steps of:

(a) calculating forward delays for each element vertex from each input vertex which connects to said each element vertex by a path of said edges, and storing said forward delays in a forward delay table;

(b) for each element vertex along the paths made of sets of said edges from an input vertex to all output vertices which connect to said input vertex:

(1) calculating backward delay for said element vertex;

(2) determining if the forward delay for said element vertex in said forward delay table is valid and, if not, calculating the forward delay for said element vertex;

(3) optimizing said element vertex by changing one or more characteristics of said associated circuit element; and (4) if said element vertex is changed by said optimization, invalidating the forward delays in said forward delay table for all element vertices preceding said element vertex;

(c) repeating foregoing step (b) for each input vertex.

4. A method as in claim 3 wherein said step of invalidating the forward delays further includes the step of updating any altered edge delays caused by said optimization.

5. A method as in claim 3 wherein said optimizing step further includes computing a new path length for each path in which the element is involved and determining if the optimization change is acceptable, if not, rejecting said optimization change.

* * * * *